(12) United States Patent  
Hara

(10) Patent No.: US 7,408,262 B2  
(45) Date of Patent: Aug. 5, 2008

(54) SEMICONDUCTOR INTEGRATED CIRCUIT DEVICE

(75) Inventor: Takahiko Hara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2 days.

(21) Appl. No.: 11/668,380

(22) Filed: Jan. 29, 2007

(65) Prior Publication Data

US 2008/0008004 A1    Jan. 10, 2008

Related U.S. Application Data

(63) Continuation of application No. PCT/JP2005/013765, filed on Jul. 27, 2005.

(30) Foreign Application Priority Data

Jul. 28, 2004    (JP) .............................. 2004-220662

(51) Int. Cl.  
*H01L 23/48* (2006.01)
(52) U.S. Cl. ............... 257/777; 257/203; 257/E27.026; 257/E25.029; 257/E23.169; 365/185.23; 365/230.06
(58) Field of Classification Search ................. 257/777, 257/E27.026  
See application file for complete search history.

(56) References Cited

U.S. PATENT DOCUMENTS 6,274,928 B1 * 8/2001 Casper et al. ............... 257/691  
6,362,994 B1 * 3/2002 Raad ........................... 365/51

FOREIGN PATENT DOCUMENTS

| JP | 58-32295 | 2/1983 |
| JP | 62-11262 | 1/1987 |
| JP | 2-2668 | 1/1990 |
| JP | 3-203085 | 9/1991 |
| JP | 3-214669 | 9/1991 |
| JP | 2001-217383 | 8/2001 |
| KR | 1991-0020721 | 12/1991 |
| KR | 1999-0036789 | 5/1999 |

* cited by examiner

*Primary Examiner*—Tu-Tu V Ho  
(74) *Attorney, Agent, or Firm*—Oblon, Spivak, McClelland, Maier & Neustadt, P.C.

(57) ABSTRACT

A semiconductor integrated circuit device includes a semiconductor chip, a memory cell array arranged on the semiconductor chip and first and second decoder strings arranged along both ends of the memory cell array. The arrangement position of the first decoder string is deviated from the arrangement position of the second decoder string and a space caused by the deviation is arranged in the corner of the semiconductor chip.

4 Claims, 5 Drawing Sheets

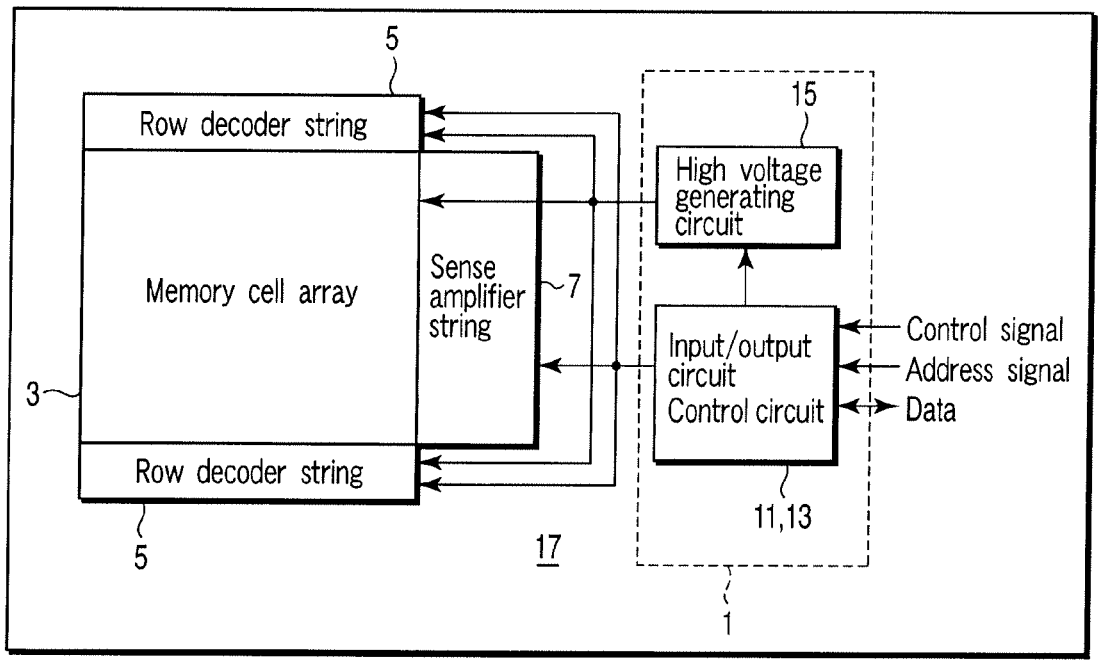
F I G. 1
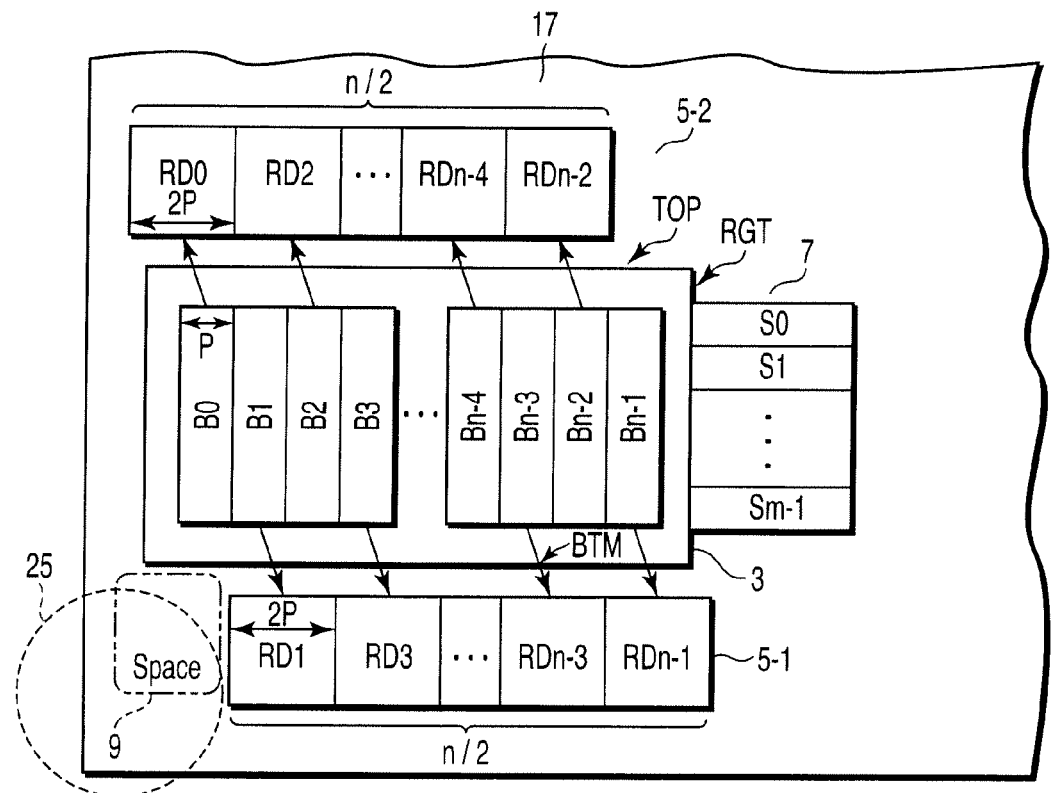
F I G. 2

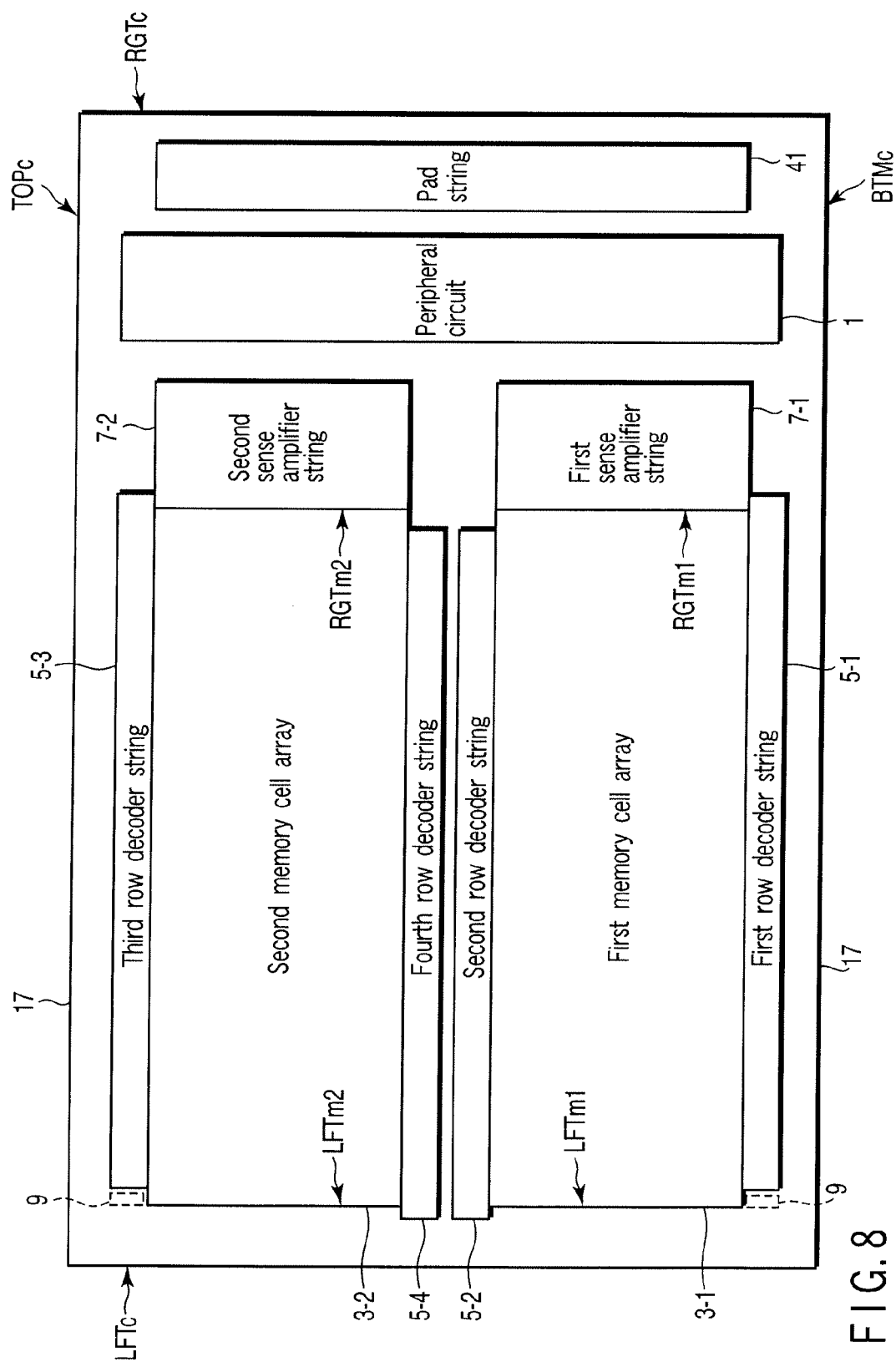
F I G. 8

SEMICONDUCTOR INTEGRATED CIRCUIT DEVICE

CROSS REFERENCE TO RELATED APPLICATIONS

This is a Continuation Application of PCT Application No. PCT/JP2005/013765, filed Jul. 27, 2005, which was published under PCT Article 21(2) in Japanese.

This application is based upon and claims the benefit of priority from prior Japanese Patent Application No. 2004-220662, filed Jul. 28, 2004, the entire contents of which are incorporated herein by reference.

BACKGROUND OF THE INVENTION

1. Field of the Invention

This invention relates to a semiconductor integrated circuit device and more particularly to a chip layout of a semiconductor memory.

2. Description of the Related Art

The demands of nonvolatile semiconductor memories which can easily store sound and images and memory cards which contain the nonvolatile semiconductor memories are rapidly expanded with the spread of digital still cameras and camera-equipped mobile phones. In the above application, since a large capacity memory is required, it is important to suppress the bit-unit price of the memory so as not to apply a heavy burden to the user.

In order to keep the bit-unit price low and provide an inexpensive nonvolatile semiconductor memory with large capacity, it is effective to reduce the chip area and enhance the manufacturing yield. In order to achieve these, it is necessary to devise a good way so as to easily make the chip layout with a small area.

An example of the chip layout which is now well known in the art is described in U.S. Pat. Specification No. 5,625,590 (Reference Document 1) and Jpn. Pat. Appln. KOKAI Publication No. 2001-217383 (Reference Document 2), for example.

Reference Document 1 is an example in which row decoders are arranged on both ends of a memory cell array.

Reference Document 2 is an example in which pad strings are arranged on a line.

BRIEF SUMMARY OF THE INVENTION

This invention provides a semiconductor integrated circuit device having an inexpensive nonvolatile semiconductor memory with large capacity.

A semiconductor integrated circuit device according to a first embodiment of this invention comprises a semiconductor chip, a memory cell array arranged on the semiconductor chip, and first and second decoder strings arranged on both ends of the memory cell, wherein the arrangement position of the first decoder string is deviated from the arrangement position of the second decoder string and a space caused by the deviation is arranged in the corner of the semiconductor chip.

A semiconductor integrated circuit device according to a second embodiment of this invention comprises a semiconductor chip, a first memory cell array arranged on the semiconductor chip, first and second decoder strings arranged along both ends of the first memory cell array, a second memory cell array arranged along the second decoder string on the semiconductor chip, and third and fourth decoder strings arranged along both ends of the second memory cell array, wherein the arrangement positions of the first and third decoder strings are deviated from the arrangement positions of the second and fourth decoder strings and spaces caused by the deviation are arranged in the corners of the semiconductor chip.

BRIEF DESCRIPTION OF THE SEVERAL VIEWS OF THE DRAWING

FIG. 1 is a block diagram showing an example of the configuration of a semiconductor integrated circuit device according to a first embodiment of this invention.

FIG. 2 is a plan view showing a layout example of the semiconductor integrated circuit device according to the first embodiment of this invention.

FIG. 8 is a plan view of a layout example of a semiconductor integrated circuit device according to a second embodiment of this invention.

DETAILED DESCRIPTION OF THE INVENTION

There will now be described embodiments of this invention with reference to the drawings. In giving the explanation, common reference symbols are attached to common portions throughout the drawings.

First Embodiment

Figure 3:
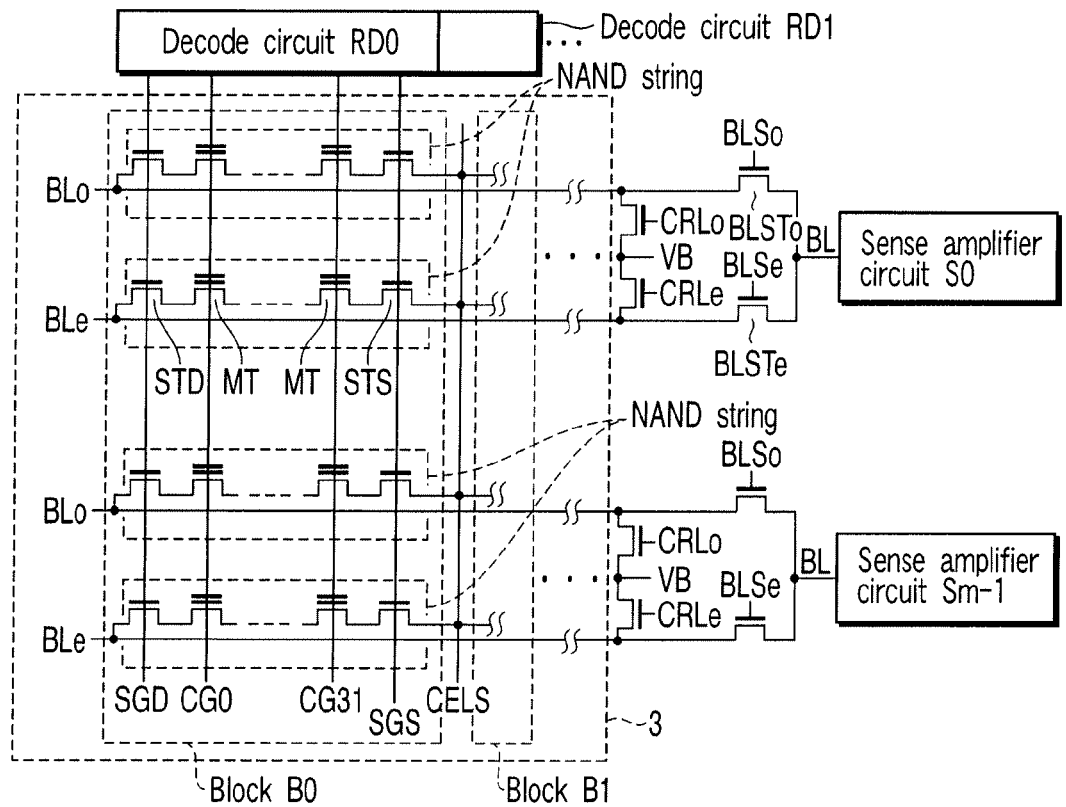
FIG. 3 is a circuit diagram showing a circuit example of the semiconductor integrated circuit device according to the first embodiment of this invention.

FIG. 1 is a block diagram showing an example of the configuration of a semiconductor integrated circuit device according to a first embodiment of this invention, FIG. 2 is a plan view showing a layout example of the semiconductor integrated circuit device according to the first embodiment of this invention and FIG. 3 is a circuit diagram showing a circuit example of the semiconductor integrated circuit device according to the first embodiment of this invention.

As shown in FIG. 1, the semiconductor integrated circuit device according to the first embodiment includes a peripheral circuit 1, memory cell array 3, decoder strings (in this example, row decoder strings as an example) 5, and sense amplifier string 7. For example, the peripheral circuit 1 includes a control circuit 11, input/output circuit 13, and high voltage generating circuit 15. The circuit blocks shown in FIG. 1 are each arranged in a semiconductor chip 17.

For example, the control circuit 11 receives various control signals and address signal to control the operation of the semiconductor integrated circuit device.

The decoder string 5 includes a plurality of decode circuits. The decode circuit selects a memory cell in the memory cell array 3 according to the control signal and address signal output from the control circuit 11. In this example, since a row decoder string is shown as one example of the decoder string 5, the decode circuit is a row decode circuit. The row decode circuit selects a row on the memory cell array 3 and drives the control gate line and selection gate line.

The sense amplifier string 7 includes a plurality of sense amplifier circuits. The sense amplifier circuit amplifies data of the memory cell according to a control signal.

The input/output circuit 13 outputs data read from the memory cell and outputs input write data to the memory cell array 3.

For example, the high voltage generating circuit 15 generates voltage higher than power supply voltage and supplies the same to the memory cell array 3 and decoder strings 5. The high voltage generating circuit 15 is provided as required. For example, it is a case wherein the memory cell is a nonvolatile semiconductor memory cell. For example, the nonvolatile semiconductor memory cell requires high voltage at the data write time and data erase time. For example, when the nonvolatile semiconductor memory cell is an EEPROM cell, high voltage is applied to the control gate at the data write time and high voltage is applied to the semiconductor substrate or well region in which the memory cell array 3 is formed at the data erase time.

As shown in FIG. 2, the decoder strings 5 of the semiconductor integrated circuit device according to the first embodiment include a first row decoder string 5-1 and second row decoder string 5-2. The first row decoder string 5-1 and second row decoder string 5-2 are arranged along both ends of the memory cell array 3 on the chip 17. For example, memory cells are arranged in a matrix form in the memory cell array 3. The memory cell array 3 of this example includes n blocks B (B0, B1, ..., Bn-1). The circuit example of the blocks B is shown in FIG. 3.

The circuit example shown in FIG. 3 is an example of a NAND type nonvolatile semiconductor memory.

As shown in FIG. 3, the basic configuration of the memory cell of the NAND type nonvolatile semiconductor memory is a NAND string connected between a bit line BL and a source line CELS. The NAND string includes a plurality of floating gate type memory cell transistors MT serially connected, a selection transistor STD which connects, for example, the drain of the memory cell transistor MT to the bit line BL, and a selection transistor STS which connects, for example, the source of the memory cell transistor MT to the source line CELS. In this example, 32 memory cell transistors MT are provided and the control gates of the respective transistors MT are respectively connected to control gate lines (word lines) CG0 to CG31. The gates of the selection transistors STS are connected to a drain-side selection gate line SGD and the gates of the selection transistors STD are connected to a source-side selection gate line SGS.

One block B is configured to include a plurality of NAND strings which commonly use the selection gate lines SGD, SGS and control gate lines CG0 to CG31. The gate lines SGD, SGS and CG0 to CG31 are connected to a different one of the row decode circuits DR (DR0, DR1, ...) for each block B.

The bit lines BL include even-numbered bit lines BLe and odd-numbered bit lines BLo. The bit lines BLe and BLo are connected to one sense amplifier circuit S (S0, ..., Sm-1) via respective bit line selection transistors BLSTe and BLSTo.

Figure 4:
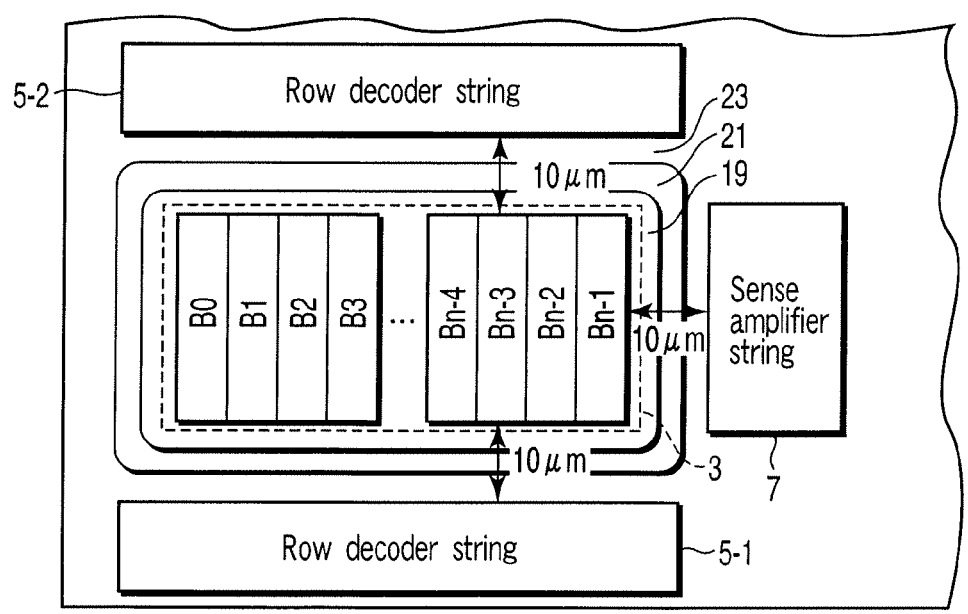
FIG. 4 is a plan view showing an example of the substrate structure of the semiconductor integrated circuit device according to the first embodiment of this invention.

FIG. 4 shows an example of the basic structure of the semiconductor integrated circuit device according to the first embodiment.

For example, the memory cell transistors MT, selection transistors STS, STD are formed in a P-type well region 19 shown in FIG. 4. That is, the memory cell array 3 is formed in the P-type well region 19. The P-type well region 19, an N-type well region 21 which separates the P-type well region 19 from a P-type silicon substrate 23 and the P-type silicon substrate 23 in which the N-type well region 21 is formed are sequentially formed around the memory cell array 3. Further, diffusion layers (not shown) via which potentials are respectively applied to the P-type well region, N-type well region and P-type silicon substrate may be sequentially arranged around the memory cell array 3 in some cases. Therefore, the distance from the block B in the memory cell array 3 to the first row decoder string 5-1, second row decoder string 5-1, sense amplifier string 7 becomes approximately 10 μm. Of course, the value of the distance is variously changed according to the size of the integrated circuit.

The memory cell array 3 configured with a regular simple pattern can be further miniaturized with the technical progress. However, it is extremely difficult to miniaturize a decode circuit RD which transfers high voltage, for example, approximately 20 V to the memory cell transistor MT at the data write time. For this reason, it becomes more difficult to lay out the decode circuit RD corresponding to one block B in the layout pitch "P" of one block B as the design rule is further reduced.

In this case, as shown in FIG. 2, n decode circuits RD are divided by two sections each having n/2 circuits on both ends of the memory cell array 3 and arranged along both ends of the memory cell array 3. As a result, it becomes possible to lay out the decode circuit RD corresponding to the block B in the layout pitch of two blocks B and the above difficulty can be solved.

Specifically, as shown in FIG. 2, the decode circuits RD are laid out in the first row decoder string 5-1 and second row decoder string 5-2 with the layout pitch "2P" of the width of two blocks B. For example, the decode circuits RD1, RD3, ... corresponding to the odd-numbered blocks B1, B3, ... are laid out in the first row decoder string 5-1 along the lower side BTM of the memory cell array 3 and the decode circuits RD0, RD2, ... corresponding to the even-numbered blocks B0, B2, ... are laid out in the second row decoder string 5-2 along the upper side TOP of the memory cell array 3. In this case, the sense amplifier string 7 is arranged along the right side RGT of the memory cell array 3.

Further, in this example, the arrangement position of the first row decoder string 5-1 is deviated from the arrangement position of the second row decoder string 5-2. As a result, for example, a space 9 is formed on the left end of the first row decoder string 5-1. The space 9 is arranged in a corner 25 of the chip 17.

According to the semiconductor integrated circuit device according to the first embodiment, the following advantages can be attained.

1. The memory cell array 3 is sandwiched between the first row decoder string 5-1 and the second row decoder string 5-2. Therefore, the memory cell array 3 does not directly face the edge of the chip 17.

2. The space 9 is formed by deviating the first row decoder string 5-1 from the second row decoder string 5-2. The space 9 is arranged in the corner 25 of the chip 17. Thus, it is not required to arrange the integrated circuit in the corner 25 of the chip 17.

The above advantages are explained in more detail.

Figure 5:
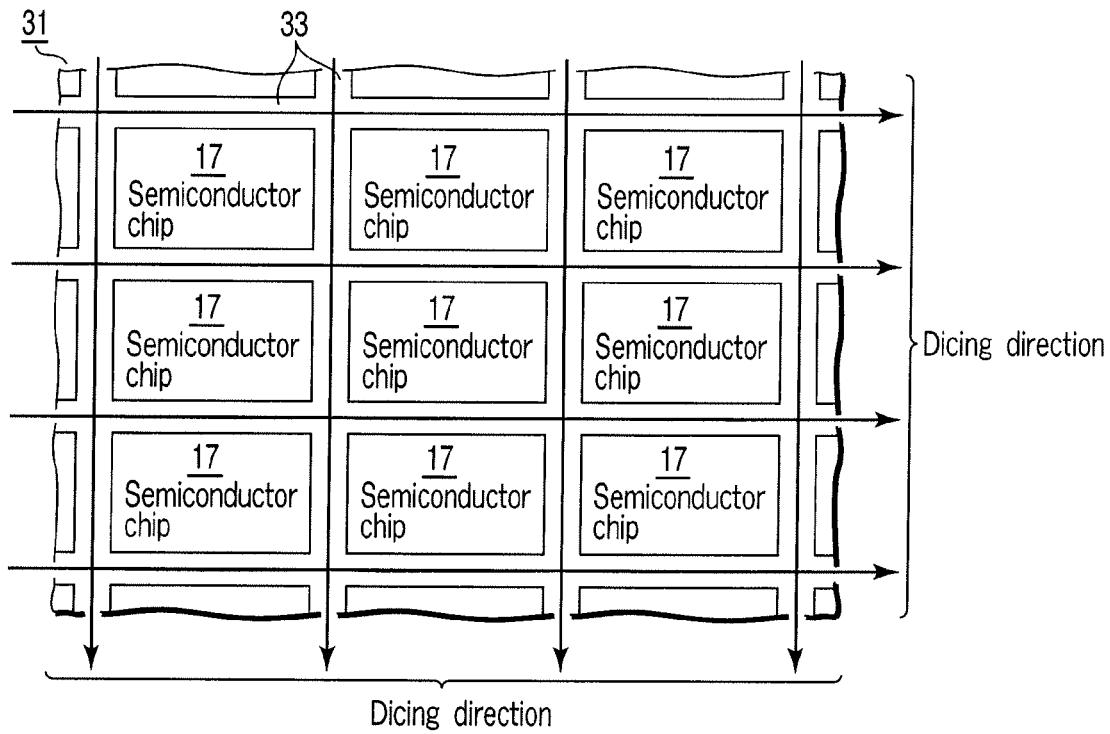
FIG. 5 is a plan view showing the state in which a semiconductor wafer is diced.

FIG. 5 is a plan view showing the state in which the semiconductor wafer is diced.

As shown in FIG. 5, a semiconductor wafer, for example, a silicon wafer 31 has dicing lines 33 and integrated circuits used as semiconductor chips 17 are formed between the dicing lines 33. The wafer 31 is diced along the dicing lines 33 and the semiconductor chips 17 are cut out from the wafer 31. At this time, there occurs a possibility that an impurity is introduced into the chip 17 via the cutout portion. If the impurity introduced into the chip 17 reaches the memory cell array 3, the threshold voltage of the memory cell transistor MT may be changed in some cases. If the threshold voltage is changed, there occurs a problem that stored data is volatilized or data cannot be correctly written. The above problem becomes more significant when the memory cell transistors MT in the memory cell array 3 are miniaturized. Even if the amount of impurity is extremely small, the miniaturized memory cell transistor MT sensitively responds thereto and the threshold voltage fluctuates. This happens even if the amount of impurity is such an amount as not to exert and influence the threshold voltage of a transistor other than the memory cell transistor MT. The permissible amount of impurity in a small-sized transistor is smaller in comparison with a large-sized transistor.

Figure 6:
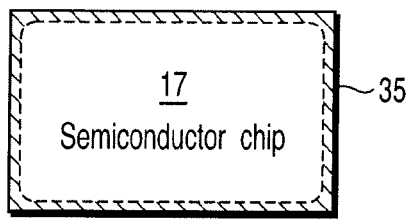
FIG. 6 is a plan view of a semiconductor chip.

In order to solve the above problem, a rule that the memory cell array 3 is not arranged in a range of a certain extent from the edge of the semiconductor chip 17 is set as indicated by a range 35 in FIG. 6 to cope with the problem. However, setting of the range 35 causes an increase in the area of the semiconductor chip 17.

Therefore, as shown in the present example, the memory cell array 3 is sandwiched between the first row decoder string 5-1 and the second row decoder string 5-2. The size of the transistors configuring the decode circuit RD in the decoder string is larger than the size of the memory cell transistor MT. That is, the permissible amount of impurity in the transistor configuring the decode circuit RD is larger in comparison with the memory cell transistor MT. Therefore, the distance from the decoder string, in this example, the first decoder string 5-1 to the edge of the semiconductor chip 17 can be reduced. Thus, the problem that the area of the semiconductor chip 17 increases can be alleviated.

Figure 7:
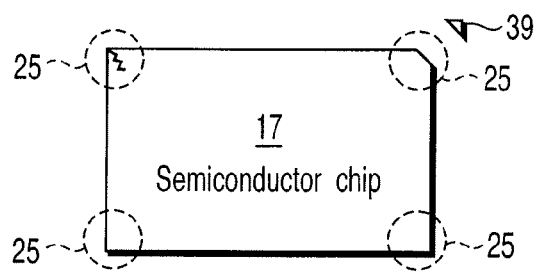
FIG. 7 is a plan view of a semiconductor chip.

Further, shear stress tends to be applied to a portion near the corner 25 of the semiconductor chip 17 at the dicing time and the mechanical strength becomes weak. Therefore, as shown in FIG. 7, a crack 37 occurs or it is cut away as shown by a reference symbol 39. Therefore, the integrated circuit must be laid out apart from the corners 25. This also causes the area of the semiconductor chip 17 to increase.

Therefore, as in this example, the space 9 is arranged in the corner 25. For example, the space 9 can be set as a layout inhibition region in which the layout is inhibited. If the space 9 is set as the layout inhibition region, the integrated circuit, for example, the memory cell array 3 and decoder string, in this example, the first decoder string 5-1 is automatically separated from the corner 25. Therefore, the problem that the area of the semiconductor chip 17 increases can be alleviated.

Second Embodiment

FIG. 8 is a plan view showing the layout example of a semiconductor integrated circuit device according to a second embodiment of this invention.

As shown in FIG. 8, the semiconductor integrated circuit device according to the second embodiment has a pad string 41 arranged only one side of a chip 17. In this example, the pad string 41 is arranged along the right side RGTc among the four sides TOPc, BTMc, RGTc and LFTc of the chip 17. For example, pads for data and address input/output, a pad for a control signal to control the operation of the chip 17 and a power supply pad are arranged in the pad string 41.

Two memory cell arrays 3 of this example are provided and arranged side by side in a vertical direction on the semiconductor chip 17. A first memory cell array 3-1 is arranged between a first row decoder string 5-1 and a second row decoder string 5-2. A second memory cell array 3-2 is arranged between a third row decoder string 5-3 and a fourth row decoder string 5-4. In this example, the first row decoder string 5-1 is arranged along the lower side BTMc of the chip 17 and the third row decoder string 5-2 is arranged along the upper side TOPc of the chip 17.

A first sense amplifier string 7-1 is arranged along the right side RGTm1 of the first memory cell array 3-1 and a second sense amplifier string 7-2 is arranged along the right side RGTm2 of the second memory cell array 3-2. A peripheral circuit 1 is arranged between the first and second sense amplifier strings 7-1, 7-2 and the pad string 41.

In the above circuit layout, the pad string 41 faces the right side RGTc of the chip 17. Likewise, the first row decoder string 5-1 faces the lower side BTMc of the chip 17 and the third row decoder string 5-3 faces the upper side TOPc of the chip 17. The left side LFTm1 of the first memory cell array 3-1 and the left side LFTm2 of the second memory cell array 3-2 face the left side LFTc of the chip 17.

According to the second embodiment, the arrangement positions of the first row decoder string 5-1 and third row decoder string 5-3 are respectively deviated from the arrangement positions of the second row decoder string 5-2 and fourth row decoder string 5-4 and spaces 9 caused by the above deviation are respectively arranged in the corners of the semiconductor chip 17. Therefore, like the first embodiment, the problem that the area of the semiconductor chip 17 increases can be alleviated.

Third Embodiment

A third embodiment is an example in which row decoder circuits RD are arranged in a layout pitch 2P of two blocks.

Figure 9:
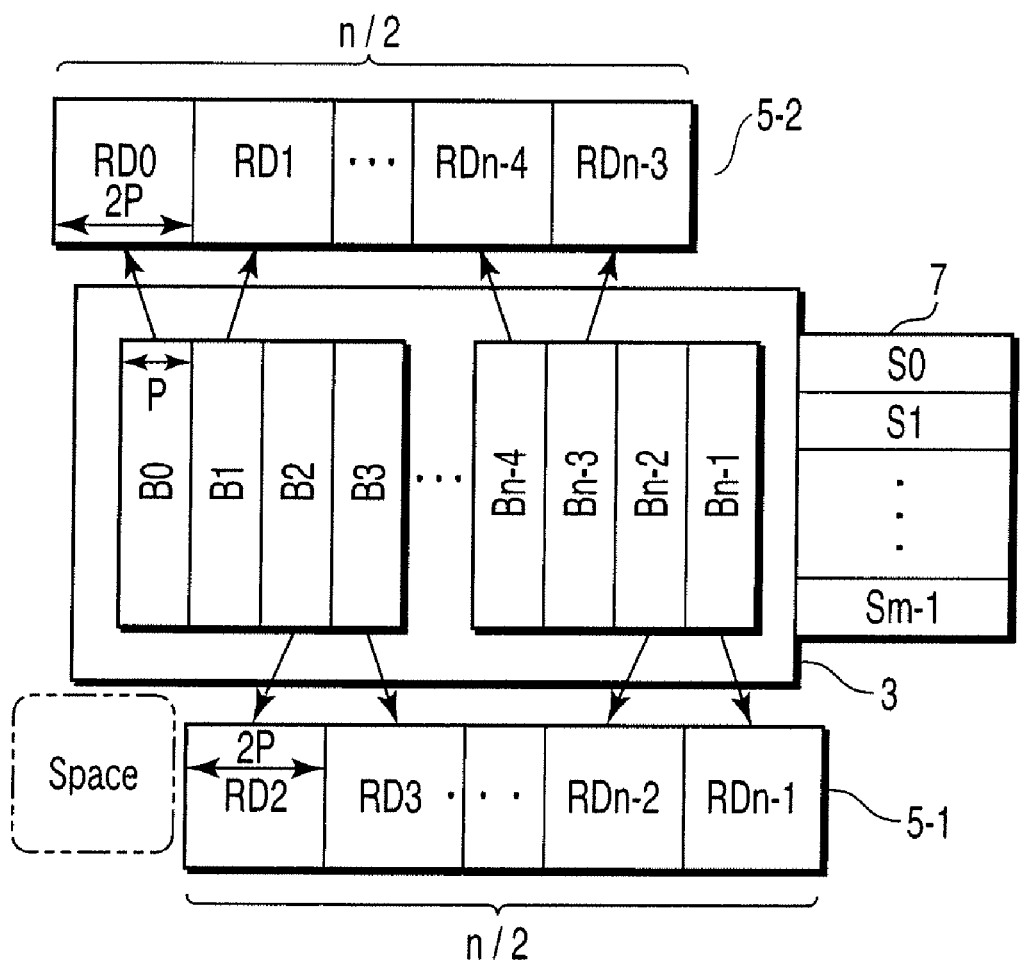
FIG. 9 is a plan view of a layout example of a semiconductor integrated circuit device according to a third embodiment of this invention.

FIG. 9 is a plan view showing a layout example of a semiconductor integrated circuit device according to the third embodiment of this invention.

As shown in FIG. 9, row decoder circuits RD each corresponding to one block are laid out in a layout pitch 2P of two blocks like the first embodiment, but row decoder circuits RD corresponding to two blocks which are successively arranged are arranged on the same side of the memory cell array 3 unlike the first embodiment. That is, row decoder circuits RD0, RD1 corresponding to blocks B0, B1 are arranged along the upper side TOP of the memory cell array 3 and row decoder circuits RD2, RD3 corresponding to blocks B2, B3 are arranged along the lower side BTM of the memory cell array 3.

According to the third embodiment, the positions of the row decoder strings are deviated by one block length in the upper and lower portions of the cell array to form a space 9. Therefore, like the first, second embodiments, the problem that the area of the semiconductor chip 17 increases can be alleviated.

This invention has been thus explained by use of a plurality of embodiments, but this invention is not limited to the embodiments and can be variously modified without departing from the essential points of this invention when embodying this invention.

Further, the respective embodiments can be independently embodied, but can be adequately combined and embodied.

In addition, the respective embodiments contain inventions of various stages and the inventions of various stages can be extracted by adequately combining a plurality of constituents disclosed in the respective embodiments.

Further, the respective embodiments are explained based on an example in which this invention is applied to the NAND type nonvolatile semiconductor memory, but this invention is not limited to the NAND type nonvolatile semiconductor memory and a semiconductor integrated circuit device containing a NAND type nonvolatile semiconductor memory, for example, a processor, system LSI or the like is contained in the range of this invention. Further, this invention can be applied to a semiconductor memory other than the NAND type nonvolatile semiconductor memory.

This invention can be utilized for a semiconductor integrated circuit device having a nonvolatile semiconductor memory of large capacity.

What is claimed is:

1. A semiconductor integrated circuit device comprising:
a semiconductor chip,
a memory cell array arranged on the semiconductor chip, and
first and second decoder strings arranged along both ends of the memory cell array on the semiconductor chip,
wherein the arrangement position of the first decoder string is deviated from the arrangement position of the second decoder string and a space caused by the deviation is arranged in a corner of the semiconductor chip.

2. A semiconductor integrated circuit device comprising:
a semiconductor chip,
a first memory cell array arranged on the semiconductor chip,
first and second decoder strings arranged along both ends of the first memory cell array on the semiconductor chip,
a second memory cell array arranged along the second decoder string on the semiconductor chip, and
third and fourth decoder strings arranged along both ends of the second memory cell array on the semiconductor chip,
wherein arrangement positions of the first and third decoder strings are deviated from arrangement positions of the second and fourth decoder strings and spaces caused by the deviation are arranged in corners of the semiconductor chip.

3. The semiconductor integrated circuit device according to claim 1, wherein the memory cell array includes a plurality of blocks which commonly use selection gate lines and control gate lines, the first and second decoder strings include decode circuits respectively provided for the plurality of blocks, and the layout pitch of the decode circuits is twice the layout pitch of the blocks.

4. The semiconductor integrated circuit device according to claim 2, wherein the first and second memory cell arrays include a plurality of blocks which commonly use selection gate lines and control gate lines, the first, second, third and fourth decoder strings include decode circuits respectively provided for the plurality of blocks, and the layout pitch of the decode circuits is twice the layout pitch of the blocks.

* * * * *